United States Patent
Chiyo

(10) Patent No.: US 6,861,275 B2
(45) Date of Patent: Mar. 1, 2005

(54) METHOD FOR PRODUCING GROUP III NITRIDE COMPOUND SEMICONDUCTOR DEVICE

(75) Inventor: Toshiaki Chiyo, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/413,384

(22) Filed: Apr. 15, 2003

(65) Prior Publication Data

US 2003/0194826 A1 Oct. 16, 2003

(30) Foreign Application Priority Data

Apr. 16, 2002 (JP) .................................... P2002-113058

(51) Int. Cl.$^7$ .............................................. H01L 21/00
(52) U.S. Cl. ......................................... 438/47; 438/29
(58) Field of Search ........................... 438/47, 29, 745

(56) References Cited

U.S. PATENT DOCUMENTS 6,033,927 A * 3/2000 Shibata et al. ................ 438/33
6,100,545 A * 8/2000 Chiyo et al. ................. 257/98

FOREIGN PATENT DOCUMENTS

| JP | 2-257679 | 10/1990 |
|---|---|---|
| JP | 3-218625 | 9/1991 |
| JP | 6-314822 | 11/1994 |
| JP | 6-338632 | 12/1994 |
| JP | 7-297494 | 11/1995 |
| JP | 7-297495 | 11/1995 |
| JP | 8-153933 | 6/1996 |

* cited by examiner

Primary Examiner—George Fourson
Assistant Examiner—Fernando L. Toledo
(74) Attorney, Agent, or Firm—McGinn & Gibb, PLLC

(57) ABSTRACT

A method of producing a Group III nitride compound semiconductor device, has the following steps of: forming an n-type layer on a substrate; forming a layer containing a light emitting layer on the n-type layer; forming a p-type layer being doped with a p-type impurity on the layer; etching at least a portion of the n-type layer and at least a portion of the layer to reveal at least a part of the n-type layer and an end surface of the layer; forming a p-electrode on a surface side of the p-type layer; forming an n-electrode on the revealed part of the n-type layer; irradiating the p-type layer with an electron beam to make resistance of the p-type layer low; and acidizing at least the revealed end surface of the layer after the electron beam irradiating step.

16 Claims, 3 Drawing Sheets

US 6,861,275 B2

METHOD FOR PRODUCING GROUP III NITRIDE COMPOUND SEMICONDUCTOR DEVICE

The present application is based on Japanese Patent Application No. 2002-113058, which is incorporated herein by reference.

BACKGROUND OF THE INVENTION

1. Field of Invention

The present invention relates to a method for producing a Group III nitride compound semiconductor device. Particularly, it relates to a method for producing such a semiconductor device in which a leakage current is suppressed.

2. Description of the Related Art

A Group III nitride compound semiconductor device has semiconductor layers laminated on a substrate such as sapphire. Because sapphire has electrically insulating characteristic, it is impossible to provide any electrode on the substrate. Therefore, electrodes for semiconductor layers are provided on a surface side of the device. As the semiconductor layers, an n-type layer, an active layer and a p-type layer are laminated successively when viewed from the substrate side. As a result, the n-type layer is buried in the laminate. Therefore, the semiconductor layers are etched to reveal a portion of the n-type layer so that an n-electrode can be connected to the reveal portion of the n-type layer.

On the other hand, the p-type layer of Group III nitride compound semiconductor is doped with a p-type impurity. A technique of irradiating the p-type layer with an electron beam to make resistance of the p-type layer low is known.

The present inventor has repeatedly made an examination of a Group III nitride compound semiconductor device of the type having an n-electrode and a p-electrode formed on a surface side of the device and exhibiting reduction in resistance of a p-type layer due to electron beam irradiation. As a result, the inventor has found that there is fear that a leakage current may flow in between the n-electrode and the p-electrode.

Therefore, an object of the invention is to suppress the leakage current.

SUMMARY OF THE INVENTION

As a fruit of the eager examination to achieve the object of the invention, the inventor has hit on the following invention:

A method of producing a Group III nitride compound semiconductor device, comprising steps of:

forming an n-type layer on a substrate;

forming a layer containing a light emitting layer on the n-type layer;

forming a p-type layer being doped with a p-type impurity on the layer;

etching at least a portion of the n-type layer and at least a portion of the layer to reveal at least a part of the n-type layer and an end surface of the layer;

forming a p-electrode on a surface side of the p-type layer;

forming an n-electrode on the revealed part of the n-type layer;

irradiating the p-type layer with an electron beam to make resistance of the p-type layer low; and acidizing at least the revealed end surface of the layer after the electron beam irradiating step.

A preferred method of producing a Group III nitride compound semiconductor device as mentioned above, wherein the acidizing step includes steps of:

revealing the end surface formed by the etching while forming a resist on other surfaces for protecting the other surfaces;

treating the revealed end surface with acid; and removing the resist.

A preferred method of producing a Group III nitride compound semiconductor device as mentioned above, wherein the acid is at lease one selected from the group consisting of hydrofluoric acid, hydrochloric acid, sulfuric acid, and nitric acid.

A preferred method of producing a Group III nitride compound semiconductor device as mentioned above, wherein the layer containing a light emitting layer comprises a Group III nitride compound semiconductor layer containing In, which is revealed on the end surface formed by the etching.

DETAILED DESCRIPTION OF THE PREFERRED EMBODIMENTS

Figure 1:
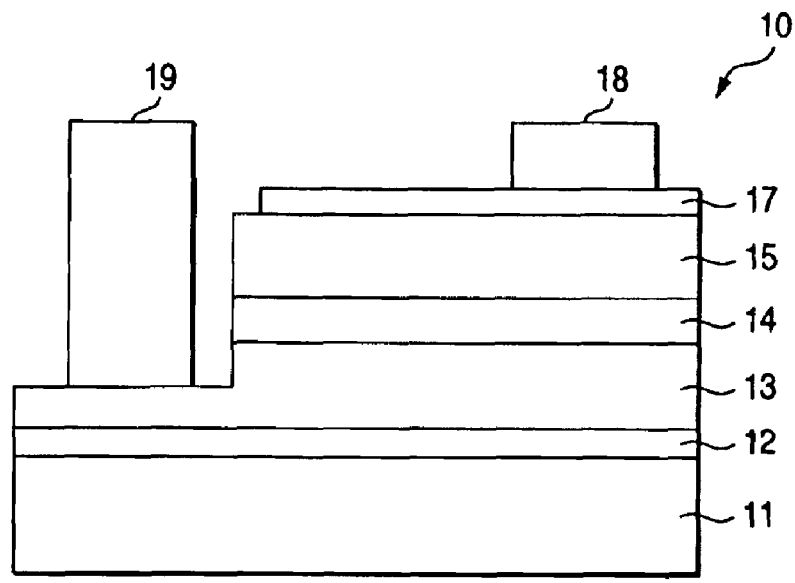
FIG. 1 is a sectional view typically showing the configuration of a light-emitting device according to an embodiment of the invention.

According to the invention, suppression of a leakage current can be achieved successfully by a very simple and inexpensive method of acidizing the end surface formed by etching. Hence, the performance of the obtained Group III nitride compound semiconductor device is improved (suppression of consumed electric power) and the reliability thereof is improved.

The reason why suppression of the leakage current can be achieved by acidizing the end surface formed by etching can be thought of as follows.

First, active oxygen is produced in an atmosphere of the device by an electron beam applied under atmospheric pressure in order to reduce the resistance of the p-type layer. The active oxygen reacts with Group III nitride atoms on the end surface formed by etching, so that oxide is formed on the end surface. The oxide is supposed to be a cause of occurrence of the leakage current. According to the inventor's examination, it has been found that the leakage current becomes large particularly when $InO_x$ is formed on the end surface by reaction of active oxygen with indium (In).

In the invention, therefore, the end surface formed by etching is treated with acid to thereby remove Group III nitride element oxide formed on the end surface. Incidentally, although the oxide can be removed by dry etching, the dry etching is undesirable because unavoidable damage is also given to the semiconductor.

Constituent members of the invention will be described below.

Group III Nitride Compound Semiconductor Device

Examples of the Group III nitride compound semiconductor device may include: optical devices such as a light-emitting diode, a light-receiving diode, a laser diode and a solar cell; bipolar devices such as a rectifier, a thyristor and a transistor; unipolar devices such as an FET; and electronic devices such as a microwave device.

Each of these devices is basically configured so that Group III nitride compound semiconductor layers are laminated on a substrate to form a device and then a p-electrode and an n-electrode are formed on a surface side of the device.

Any substrate may be used if the Group III nitride compound semiconductor layers can be grown on the substrate. Examples of the material used for forming the substrate may include sapphire, spinel, silicon, siliconcarbide, zincoxide, gallium phosphide, gallium arsenide, magnesium oxide, and manganese oxide. Especially, a sapphire substrate is preferably used. More especially, a surface a or c of the sapphire substrate is preferably used for growing Group III nitride compound semiconductor layers with good crystallinity.

Group III nitride compound semiconductor layers are laminated on the substrate. In this specification, each Group III nitride compound semiconductor is represented by the general formula: $Al_xGa_yIn_{1-x-y}N$ ($0 \leq X \leq 1, 0 \leq Y \leq 1, 0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ ($0<x<1$ in the above). The group III elements may be at least partially replaced by boron (B), thallium (Tl), or the like. The nitrogen (N) may be at least partially replaced by phosphorus (P), arsenic (As), antimony (Sb), bismuth (Bi), or the like. Each of the group III nitride compound semiconductor layers may contain an optional dopant. Si, Ge, Se, Te, C, or the like, can be used as an n-type impurity. Mg, Zn, Be, Ca, Sr, Ba, or the like, can be used as a p-type impurity. The method of forming each group III nitride compound semiconductor layer is not particularly limited. For example, the group III nitride compound semiconductor layer can be formed by a known method such as a metal organic chemical vapor deposition method (MOCVD method), a molecular beam epitaxy method (MBE method), a halide vapor phase epitaxy method (HVPE method), a sputtering method, an ion-plating method, or an electron showering method.

A buffer layer may be provided between the substrate and the crystal layer of Group III nitride compound semiconductor. The buffer layer is provided for improving the crystallinity of the Group III nitride compound semiconductor grown on the buffer layer. The buffer layer can be made of a Group III nitride compound semiconductor such as AlN, InN, GaN, AlGaN, InGaN or AlInGaN.

A metal such as Al, V, Sn, Rh, Ti, Cr, Nb, Ta, Mo, W, or Hf, or an alloy of any two or more kinds of metals selected from these metals can be used as the material of the n-electrode. The n-electrode may be provided as a two-layer or multi-layer structure constituted by a laminate of layers different in composition. For example, the n-electrode may be provided as a two-layer structure of V and Al.

A metal such as Rh, Au, Pt, Ag, Cu, Al, Ni, Co, Mg, Pd, Ru, Mn, Bi, Sn, or Re, or an alloy of any two or more kinds of metals selected from these metals can be used as the material of the p-electrode. The p-electrode may be provided as a two-layer or multi-layer structure constituted by a laminate of layers different in composition.

Each of the n-electrode and the p-electrode is formed by a known film-forming method such as vapor deposition or sputtering.

For example, a Group III nitride compound semiconductor light-emitting device is produced as follows.

First, a substrate on which Group III nitride compound semiconductor layers can be grown is prepared. A plurality of semiconductor layers are laminated on the substrate so that an n-type Group III nitride compound semiconductor layer, a layer containing a light emitting layer of Group III nitride compound semiconductor and a Group III nitride compound semiconductor layer doped with a p-type impurity are at least arranged in this order.

Then, a part of the n-type semiconductor layer is revealed by etching. Then, a p-electrode and an n-electrode are formed on the Group III nitride compound semiconductor layer doped with a p-type impurity and on the n-type Group III nitride compound semiconductor layer, respectively. The p-electrode and the n-electrode can be formed by a known method such as evaporation or sputtering. Then, the substrate is abraded with an abrasive having a desired particle size so that a desired thickness of the substrate is obtained. Then, the substrate is cut into chips.

Electron Beam Irradiation

The Group III nitride compound semiconductor doped with a p-type impurity is too high in resistance to satisfactorily serve as the semiconductor layer of the device, if no measure but growth is taken. Therefore, a technique of irradiating the formed layer with an electron beam to reduce the resistance of the layer has been proposed (see Japanese Patent Publication No. Hei. 2-257679).

It is preferable from the relation between production steps that this electron beam irradiation step is carried out after the formation of the n-electrode and the p-electrode. It is possible to carry out electron beam irradiation immediately after the formation of the p-type layer, though. If so, a surface of the layer containing a p-type impurity may be damaged, so that there is fear that contact resistance between the p-type layer and an electrode which will be formed on the p-type layer may become high.

It is therefore preferable that the wafer is carried to an electron beam irradiation apparatus and subjected to the electron beam irradiation step after the formation of the electrodes as well as the etching step is completed.

Acid Treatment

As described above, the acid treatment (acidization) is made for treating an end surface formed by etching. Examples of the acid used may include hydrofluoric acid, hydrochloric acid, sulfuric acid, and nitric acid. The concentration of the acid and the time required for the acid treatment are selected suitably in accordance with the material of the semiconductor or the electron beam irradiation time. All these factors can be decided or combined appropriately by the criterion whether the oxide possibly formed on the end surface is removed or not.

It is preferable that a resist or the like is formed to protect the electrodes in advance when the acid treatment is carried out after the electrodes are formed. This step is not related to the substance of the invention.

Features and advantages of the invention will be evident from the following detailed description of the preferred embodiments described in conjunction with the attached drawings.

An embodiment of the invention will be described below on the basis of a light-emitting device used as an example.

FIG. 1 is a typical sectional view of a light-emitting device 10 according to this embodiment. Specifications of respective layers in the light-emitting device 10 are as follows.

| Layer | Composition |
|---|---|
| p-type layer 15 | p-GaN: Mg |
| Layer 14 containing a light emitting layer | containing InGaN (In: about 20 atomic % in the total atoms of In and Ga) |
| n-type layer 13 | n-GaN: Si |
| Buffer layer 12 | AlN |
| Substrate 11 | sapphire |

The n-type layer 13 of GaN doped with Si as an n-type impurity is formed on the substrate 11 through the buffer layer 12. Although the case where sapphire is used as the substrate 11 is shown above, the substrate 11 is not limited thereto. For example, sapphire, spinel, silicon, silicon carbide, zinc oxide, gallium phosphate, gallium arsenide, magnesium oxide, manganese oxide, zirconium boride, or group III nitride compound semiconductor single crystal may be used as the substrate 11. The buffer layer 12 is made of AlN by a metal organic chemical vapor deposition method (MOCVD method) but the buffer layer 12 is not limited thereto. For example, GaN, InN, AlGaN, InGaN, or AlInGaN may be used as the material of the buffer layer 12. A molecular beam epitaxy method (MBE method), a halide vapor phase epitaxy method (HVPE method), a sputtering method, an ion-plating method, an electron showering method, or the like, may be used as the method for forming the buffer layer 12. When a Group III nitride compound semiconductor is used as the substrate 11, the buffer layer 12 can be dispensed with because layers formed on the substrate 11 may grow up with good crystallinity in this case.

As occasion demands, the substrate and the buffer layer may be removed after the formation of the semiconductor device.

Although the case where the n-type layer 13 is made of GaN is shown above, AlGaN, InGaN or AlInGaN may be used.

Although the case where the n-type layer 13 is doped with Si as an n-type impurity is shown above, other n-type impurities such as Ge, Se, Te, or C may be used.

The layer 14 containing a light emitting layer may contain a quantum well structure (multiple quantum well structure or single quantum well structure). The light-emitting device structure may be of a single hetero type, a double hetero type or a homo junction type.

The layer 14 containing a light emitting layer may contain a Group III nitride compound semiconductor layer doped with Mg or the like on the p-type layer 15 side and having a wide band gap. This is a technique for effectively preventing electrons injected into the layer 14 containing a light emitting layer from diffusing into the p-type layer 15.

The p-type layer 15 of GaN doped with Mg as a p-type impurity is formed on the layer 14 containing a light emitting layer. As the material of the p-type layer, GaN may be replaced by AlGaN, InGaN or InAlGaN. As the p-type impurity, Mg may be replaced by Zn, Be, Ca, Sr or Ba.

In the light-emitting diode configured as described above, each of the Group III nitride compound semiconductor layers can be formed by a metal organic chemical vapor deposition method (MOCVD method) in a general condition or formed by a method such as a molecular beam epitaxy method (MBE method), a halide vapor phase epitaxy method (HVPE method), a sputtering method, an ion-plating method, or an electron showering method.

An n-electrode 19 is constituted by two layers of Al and V. After the p-type layer 15 is formed, the p-type layer 15, the layer 14 containing a light emitting layer and the n-type layer 13 are partially removed by etching and the n-electrode 19 is formed on a revealed portion of the n-type layer 13 by vapor deposition.

A transparent electrode 17 is a thin film containing gold. The transparent electrode 17 is laminated on the p-type layer 15. A p-electrode 18 is also made of a material containing gold. The p-electrode 18 is formed on the transparent electrode 17 by vapor deposition.

Then, the sample is processed by an electron bream irradiation apparatus so that the p-type layer 15 is irradiated with an electron beam. A low energy electron beam irradiation apparatus is used in the irradiation condition of an acceleration voltage of 120 kV and an irradiation time of 3.5 minutes.

Figure 2:
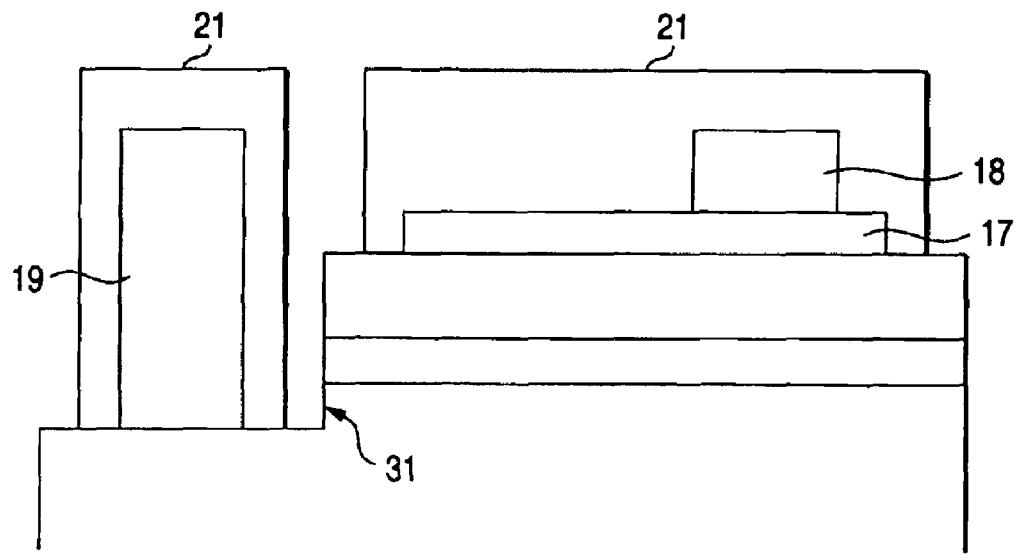
FIG. 2 is a partly enlarged sectional view showing the acidizing step.

Then, a resist 21 is applied on a surface of the sample. Then, part of the resist 21 is removed by photolithography so that the end surface 31 formed by etching is at least revealed as shown in FIG. 2. On this occasion, it is preferable that the electrode portions are perfectly protected by the resist 21. An organic resist can be used as the resist 21.

Then, the sample is immersed in a 2 weight % hydrofluoric acid solution for 15 seconds. Then, after the hydrofluoric acid solution is removed, the resist 21 is removed with an organic releasant. This is a technique for preventing the electrode portions from being damaged.

After the respective semiconductor layers and the respective electrodes are formed by the aforementioned step, the step of cutting the sample into chips is carried out.

Figure 3:
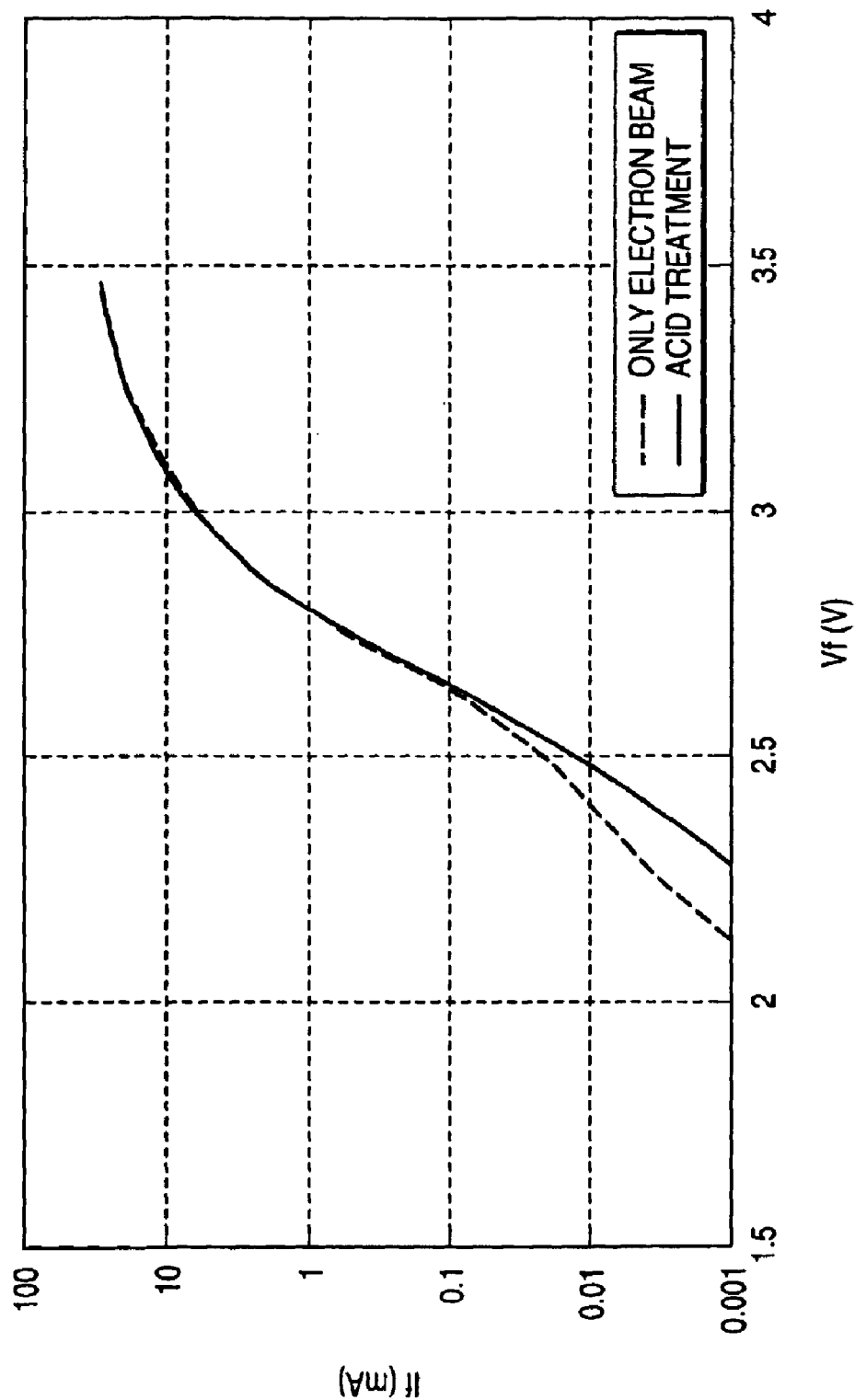
FIG. 3 is a graph showing Vf-If characteristic of the light-emitting device according to the embodiment of the invention and Vf-If characteristic of a light-emitting device as a comparative example.

FIG. 3 shows Vf-If characteristic of the light-emitting device 10 obtained thus according to the embodiment of the invention and Vf-If characteristic of a light-emitting device as a comparative example obtained in the case where the acid treatment is omitted. As is obvious from FIG. 3, flowing of a current starts at a low voltage in the light-emitting device as the comparative example obtained in the case where the acid treatment is omitted, whereas the leakage current becomes absent in the light-emitting device according to the embodiment of the invention.

Figure 4:
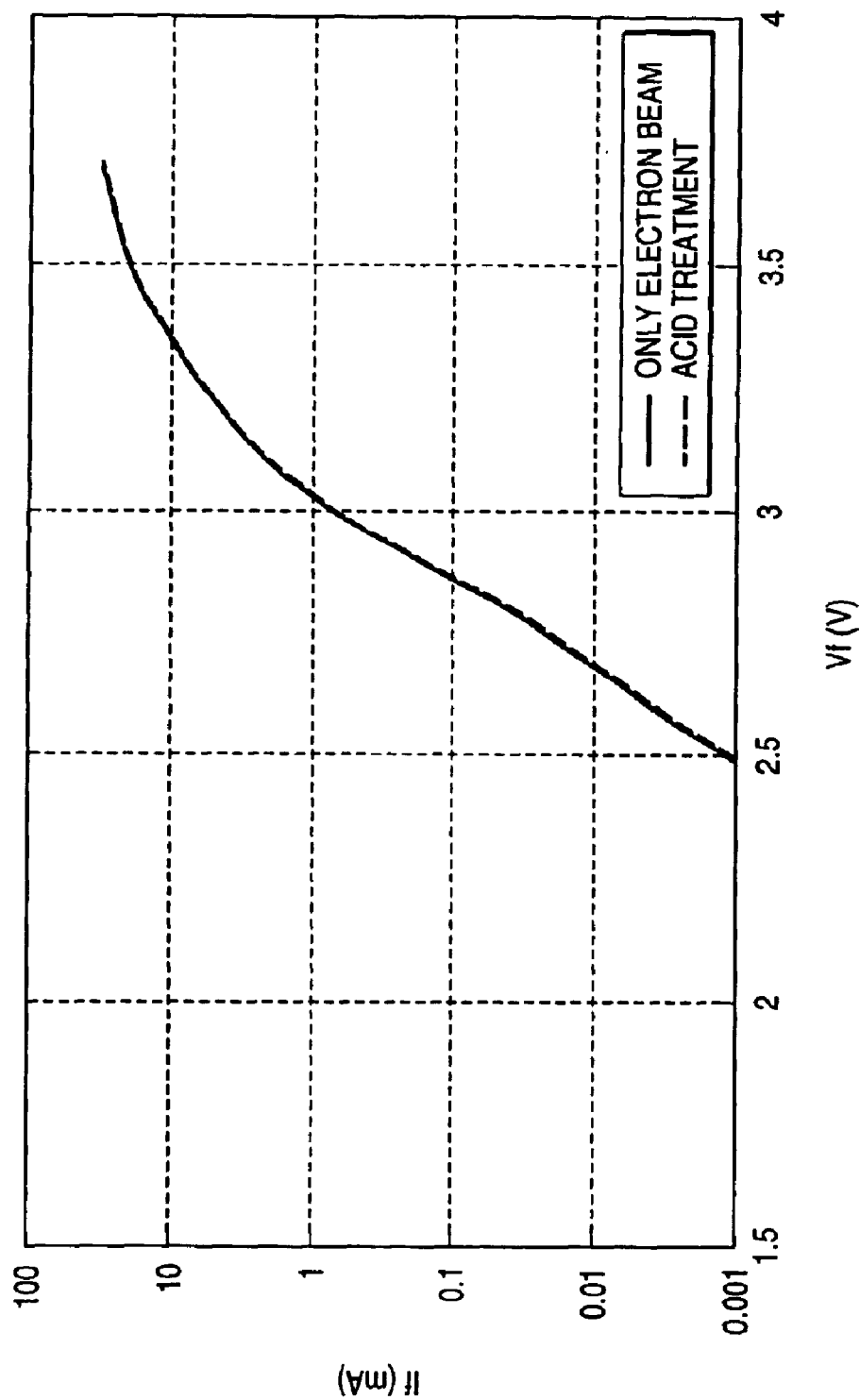
FIG. 4 is a graph showing Vf-If characteristic in the case where the composition percentage of In of the active layer is changed.

Next, the same examination as described above is performed in the condition that the composition percentage of In of the InGaN layer in the layer 14 containing a light emitting layer is changed from about 20% to about 8%. FIG. 4 shows a result of the examination.

In this example, the leakage current is little observed regardless of whether the acid treatment is carried out or not. At a guess, this is because the composition percentage of In of the InGaN layer is so low that the amount of $InO_x$ produced by interaction of active oxygen with the In atoms on the basis of the electron beam is small in the electron beam irradiation condition used in this embodiment.

Accordingly, it is conceived that the acid treatment proposed by the invention has an excellent effect when the composition percentage of In in the In-containing layer is not lower than 10%. The composition percentage of In is preferably not lower than 15% and more preferably not lower than 20%. Regardless of this fact, the substantive matter of the present invention can be applied to producing a Group III nitride compound semiconductor device, where any unwanted substance such as oxide is formed on the surface during processing steps. The above In composition percentage is just an example, and the present invention is not limited to this range.

The invention is not limited to the description of the mode for carrying out the invention and the embodiment thereof at all. Various changes which can be easily conceived by those skilled in the art are also contained in the invention if those changes do not depart from the description of the scope of claims.

What is claimed is:

1. A method of producing a Group III nitride compound semiconductor device, comprising:

forming an n-type layer on a substrate;

forming at least one layer including a light emitting layer on said n-type layer;

forming a p-type layer doped with a p-type impurity on said at least one layer;

etching a portion of said p-type layer, said at least one layer, and said n-type layer, said etching revealing an end surface of said at least one layer;

forming a p-electrode on said p-type layer;

forming an n-electrode on said portion of said n-type layer;

irradiating said p-type layer with an electron beam to reduce resistance of said p-type layer; and acidizing at least said end surface of said at least one layer after said irradiating.

2. A method of producing a Group III nitride compound semiconductor device according to claim 1, wherein said acidizing, comprises:

forming a resist on surfaces other than said end surface for protecting said surfaces;

treating said end surface with acid; and removing said resist.

3. A method of producing a Group III nitride compound semiconductor device according to claim 1, wherein an acid used for said acidizing comprises at least one of hydrofluoric acid, hydrochloric acid, sulfuric acid, and nitric acid.

4. A method of producing a Group III nitride compound semiconductor device according to claim 1, wherein said at least one layer including a light emitting layer comprises a Group III nitride compound semiconductor layer including, indium, which is revealed on said end surface formed by said etching.

5. A method of producing a Group III nitride compound semiconductor device, comprising:

forming a light emitting layer on an n-type layer;

forming a p-type layer on said light emitting layer;

etching said p-type layer and said light emitting layer to expose an end surface of said light emitting layer;

irradiating said p-type layer with an electron beam; and treating said end surface of said light emitting layer with an acid.

6. A method of producing a Group III nitride compound semiconductor device according to claim 5, wherein said light emitting layer comprises indium.

7. A method of producing a Group III nitride compound semiconductor device according to claim 5, wherein said light emitting layer comprises a plurality of Group III nitride compound semiconductor layers.

8. A method of producing a Group III nitride compound semiconductor device according to claim 5, wherein said etching includes etching an upper surface of a portion of said n-layer.

9. A method of producing a Group III nitride compound semiconductor device according to claim 8, further comprising:

forming an n-electrode on said upper surface of said portion of said n-type layer, said n-electrode being separated from said light emitting layer and said p-type layer.

10. A method of producing a Group III nitride compound semiconductor device according to claim 5, further comprising forming a p-electrode on said p-type layer.

11. A method of producing a Group III nitride compound semiconductor device according to claim 5, wherein said irradiating comprises irradiating with an electron beam using an acceleration voltage of about 120 kV and an irradiation time of about 3.5 minutes.

12. A method of producing a Group III nitride compound semiconductor device according to claim 10, further comprising:

forming a resist on said p-electrode, said p-layer, said light emitting layer, said n-layer, and said n-electrode.

13. A method of producing a Group III nitride compound semiconductor device according to claim 12, further comprising:

removing a portion of said resist to expose said end surface of said light emitting layer.

14. A method of producing a Group III nitride compound semiconductor device according to claim 5, wherein said treating comprises immersing said Group III nitride compound semiconductor device in said acid.

15. A method of producing a Group III nitride compound semiconductor device according to claim 13, further comprising:

removing a remaining portion of said resist from said Group III nitride compound semiconductor device.

16. A method of producing a Group III nitride compound semiconductor device according to claim 4, wherein a composition percentage of indium in said light emitting layer is not lower than 10%.

* * * * *